United States Patent
Zheng et al.

(10) Patent No.: US 10,964,853 B2
(45) Date of Patent: Mar. 30, 2021

(54) STABLE RED CERAMIC PHOSPHORS AND TECHNOLOGIES INCLUDING THE SAME

(71) Applicant: OSRAM Opto Semiconductors GmbH, Regensburg (DE)

(72) Inventors: Yi Zheng, Lynnfield, MA (US); Sonja Tragl, Augsburg (DE); Juliane Kechele, Stadtbergen (DE); Johanna Strube-Knyrim, Weil (DE); Madis Raukas, Lexington, MA (US); Stefan Lange, Augsburg (DE); Daniel Bichler, Augsburg (DE)

(73) Assignee: Osram Oled GmbH, Regensburg (DE)

( * ) Notice: Subject to any disclaimer, the term of this patent is extended or adjusted under 35 U.S.C. 154(b) by 363 days.

(21) Appl. No.: 15/762,126

(22) PCT Filed: Sep. 19, 2016

(86) PCT No.: PCT/US2016/052495
§ 371 (c)(1),
(2) Date: Mar. 22, 2018

(87) PCT Pub. No.: WO2017/053233
PCT Pub. Date: Mar. 30, 2017

(65) Prior Publication Data
US 2018/0277720 A1    Sep. 27, 2018

Related U.S. Application Data

(60) Provisional application No. 62/232,204, filed on Sep. 24, 2015.

(51) Int. Cl.
*H01L 33/50* (2010.01)
*C09K 11/08* (2006.01)
*C09K 11/77* (2006.01)
*C09K 11/02* (2006.01)

(52) U.S. Cl.
CPC .......... *H01L 33/502* (2013.01); *C09K 11/025* (2013.01); *C09K 11/0883* (2013.01); *C09K 11/7734* (2013.01)

(58) Field of Classification Search
CPC . H01L 33/502; C09K 11/025; C09K 11/0883; C09K 11/7734
See application file for complete search history.

(56) References Cited

U.S. PATENT DOCUMENTS

| | | | |
|---|---|---|---|
| 7,902,564 B2* | 3/2011 | Mueller-Mach | C04B 35/44 250/493.1 |
| 2008/0149956 A1 | 6/2008 | Mueller-Mach et al. | |
| 2010/0142181 A1* | 6/2010 | Schmidt | C04B 35/593 362/84 |
| 2011/0163344 A1 | 7/2011 | Cakmak et al. | |
| 2011/0279017 A1 | 11/2011 | Li et al. | |
| 2012/0007130 A1 | 1/2012 | Hoelen et al. | |
| 2014/0035455 A1 | 2/2014 | Galvez et al. | |
| 2015/0204492 A1 | 7/2015 | Bichler et al. | |
| 2015/0219291 A1 | 8/2015 | Yamaguchi | |
| 2015/0377429 A1 | 12/2015 | Yoo et al. | |
| 2016/0108311 A1 | 4/2016 | Winkler et al. | |
| 2016/0276548 A1 | 9/2016 | Yoo et al. | |

FOREIGN PATENT DOCUMENTS

| | | |
|---|---|---|
| JP | 2011012215 A | 1/2011 |
| JP | 2013216800 A | 10/2013 |
| WO | 2007131195 A2 | 11/2007 |
| WO | 2014177247 A1 | 11/2014 |
| WO | 2015038386 A1 | 3/2015 |
| WO | 2015072766 A1 | 5/2015 |

OTHER PUBLICATIONS

Japanese Office Action based on Application No. JP2018515451A, dated Jun. 3, 2019 (5 pages + 5 pages english translation) (for reference purpose only).
Notice of Refusal issued for corresponding Japanese Application No. 2018-515451, dated Feb. 3, 2020, 5 pages (for informational purpose only).
International Search Report based on application No. PCT/US2016/052495 (10 pages) dated Nov. 18, 2016 (for reference purpose only).

* cited by examiner

*Primary Examiner* — C Melissa Koslow
(74) *Attorney, Agent, or Firm* — Viering, Jentschura & Partner mbB

(57) ABSTRACT

Wavelength converters including coarse particles/grains of a red nitride phosphor are disclosed. In some embodiments the red nitride phosphor is a $(Ca,Sr,Ba)_2Si_5N_8$:Eu phosphor with a D50 grain size or a D50 particle size that is ≥5 microns. The red nitride phosphor may be encapsulated within an organic matrix or present in an inorganic matrix. In the latter case, the inorganic matrix may include fine grains with a D50 grain size <5 microns. Methods of making such wavelength converters and devices including such wavelength converters are also described.

8 Claims, 11 Drawing Sheets

STABLE RED CERAMIC PHOSPHORS AND TECHNOLOGIES INCLUDING THE SAME

CROSS REFERENCE TO RELATED APPLICATIONS

The present application is a national stage entry according to 35 U.S.C. § 371 of PCT application No. PCT/US2016/052495 filed on Sep. 19, 2016, which claims priority from U.S. provisional application No. 62/232,204 filed on Sep. 24, 2015, and is incorporated herein by reference in its entirety.

FIELD

Various embodiments relate to red ceramic phosphors and technologies including the same. More particularly, the various embodiments relate to stable red ceramic phosphors, wavelength converters including the same, and lighting devices including the same.

BACKGROUND

Radiation emitting components such as light emitting diodes (LEDs) can generate visible or non-visible light in a specific region of the electromagnetic spectrum. Depending on the material composition of an LED, its light output ("i.e., "primary light") may be light in the blue, red, green, non-visible ultra-violet (UV), and/or near-UV region of the electromagnetic spectrum. Wavelength converters may be used to construct a lighting device that produces a light output that differs from the primary light output of the light source(s) therein. For example a wavelength converter including one or more wavelength conversion materials may be employed to convert all or a portion of light of a first wavelength or wavelength range (the "primary light" or "excitation light") to light of a second wavelength or wavelength range (the "secondary light" or "emission light") using photoluminescence. In such instances, the color of the light output from the lighting device may be defined by the secondary light produced by the wavelength converter, either alone or in combination with unconverted primary light.

Photoluminescence generally involves absorbing higher energy primary light with a wavelength conversion material, such as a phosphor or mixture of phosphors. Absorption of the primary light can excite the wavelength conversion material to a higher energy state. When the wavelength conversion material returns to a lower energy state, it emits secondary light, generally of a different wavelength/wavelength range than the primary light. The wavelength/wavelength range of the secondary light can depend on the type of wavelength conversion material used. As such, secondary light of a desired wavelength/wavelength range may be attained by proper selection of wavelength conversion material. This process may be understood as "wavelength down conversion," and an LED combined with a wavelength-conversion structure that includes wavelength-conversion material, such as phosphor, to produce secondary light, may be described as a "phosphor-converted" or "wavelength-converted" LED.

A wide variety of wavelength converted lighting devices have been developed and commercialized for use in various applications. Such lighting devices can offer various benefits to end users, such as high light output, long life, and the like. For example, some wavelength converted LED lighting devices are rated for many years of service. However with such benefits come various challenges, some of which are attributable to the wavelength converters and/or wavelength conversion materials used in such devices.

For example, various nitride phosphors have been identified as being suitable for use in wavelength converters for converting all or a portion of primary light incident thereon to light in the red portion of the visible region of the electromagnetic spectrum. While such phosphors have proven quite useful, their performance may significantly degrade over time due to various factors, such as exposure to high temperature and/or high current intensity. An interest therefore remains in the development of red phosphors that exhibit improved stability at accepted operating conditions for light emitting diodes and other wavelength converted light sources.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

Figure 1:
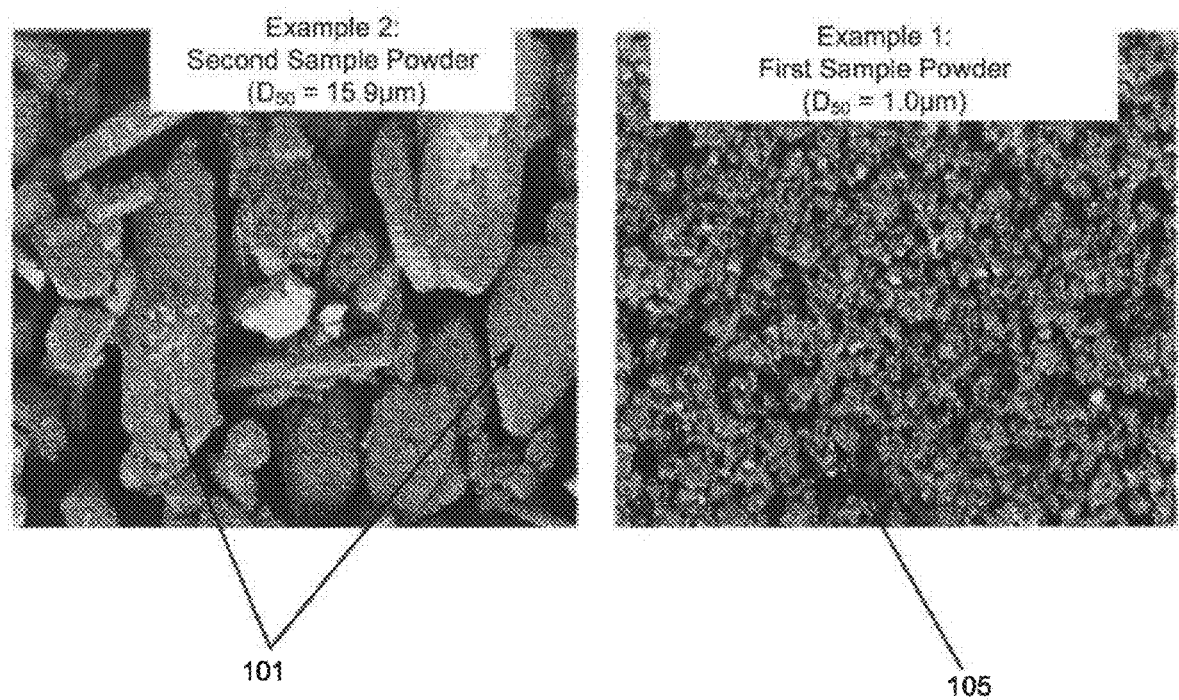
FIG. 1 provides scanning electron micrographs of two example (Ca, Sr, Ba)$_2$Si$_5$N$_8$ powders.

For a thorough understanding of the present disclosure, reference should be made to the following detailed description, including the appended claims, in connection with the above-described drawings. Although the present disclosure is described in connection with specific or exemplary embodiments, it should be understood by those skilled in the art that the disclosure is not intended to be limited to the specific forms set forth herein. It is understood that various omissions and substitutions of equivalents are contemplated as circumstances may suggest or render expedient. Also, it should be understood that the phraseology and terminology used herein is for the purpose of description and should not be regarded as limiting, except as otherwise expressly indicated.

DETAILED DESCRIPTION

As used herein, the terms "about" and "substantially" when used in connection with a numerical value or range means +/−5% of the recited numerical value or range.

From time to time one or more aspects of the present disclosure may be described using ranges. In such instances it should be understood that the indicated ranges are exemplary only unless expressly indicated otherwise. Moreover, the indicated ranges should be understood to include all of the individual values of falling within the indicated range, as though such values were expressly recited. Moreover, the ranges should be understood to encompass sub ranges within the indicated range, as though such sub ranges were expressly recited. By way of example, a range of 1 to 10 should be understood to include 2, 3, 4 . . . etc., as well as the range of 2 to 10, 3 to 10, 2 to 8, etc., as though such values and ranges were expressly recited.

The term "particle size" is used herein in contradistinction to the term "grain size." Specifically, the term "particle size" refers to the size of powder particles, whereas "grain size" is used to refer to the size of crystalline grains, for example in a consolidated (e.g., sintered) article.

The term "D50" when used in conjunction with grain size or particle size means the median grain/particle size in a cumulative grain/particle size distribution. That is, D50 means the particle/grain size at which 50% of grains/particles in a cumulative grain or particle size distribution of a sample are smaller or larger, respectively. More particularly, the term "D50 particle size" refers to the median of a cumulative particle size distribution of a sample of powder particles. In contrast, the term "D50 grain size" refers to the median of a cumulative grain size distribution of crystalline grains, e.g., in a consolidated (e.g., sintered) article. In contrast, the terms "D10" and "D90" when used in conjunction with grain size or particle size refer to the grain/particle size at which 10% and 90% of the grains/particles a cumulative grain/particle size distribution of a sample are smaller ($D_{10}$) or larger ($D_{90}$).

The term, "coarse," when used in conjunction with particles or grains means that the particles/grains have a D50 greater than or equal to 5 micrometers ("microns" or "µm"), such as greater than or equal to about 10 µm, greater than or equal to about 15 µm, or even greater than or equal to about 20 µm. In contrast the term "fine" when used in conjunction with particles or grains means that the particles/grains have a D50 less than 5 µm, such as less than 2.5p or even less than or equal to about 1 µm.

As used herein, the term "optically transparent" when used in connection with a material (e.g., a matrix or a filler), means that the reference material transmits greater than or equal to about 80% of incident light, such as greater than or equal to about 90%, greater than or equal to about 95%, greater than or equal to about 99%, or even about 100% of incident light. The incident light may be of a specified wavelength or wavelength range (e.g., ultraviolet, visible, infrared, etc.), or may span multiple wavelength ranges. Without limitation, materials described herein as being optically transparent preferably transmit greater than or equal to about 95% (e.g., greater than or equal to about 99% or even about 100%) of light in at least one of the ultraviolet, visible, and infrared regions of the electromagnetic spectrum.

As used herein, the terms, "light emitting diode," "LED," and "LED light source" are used interchangeably, and refer to any light emitting diode or other type of carrier injection/junction-based system that is capable of generating radiation in response to an electrical signal. Thus, the term LED includes, but is not limited to, various semiconductor-based structures that emit light in response to current, light emitting polymers, light emitting stripes, electro-luminescent strips, combination thereof and the like.

In particular, the terms "LED refers to light emitting diodes of all types (including semi-conductor and organic light emitting diodes) that may be configured to generate primary light in all or various portions of one or more of the visible, ultraviolet, and UV spectrum. Non-limiting examples of suitable LEDs that may be used include various types of infrared LEDs, ultraviolet LEDs, red LEDs, green LEDs, blue LEDs, yellow LEDs, amber LEDs, orange LEDs, and white LEDs. Such LEDs may be configured to emit light over a broad spectrum (e.g., the entire visible light spectrum) or a narrow spectrum.

As used herein the term "improved stability" when used in connection with a wavelength converter or a wavelength conversion material, means that the wavelength converter or wavelength conversion material exhibited better results when subject to a stability test, as compared to another material subject to the same test. For example the relative stability of a wavelength converter and/or a wavelength conversion material may be determined by subjecting the wavelength converter and/or wavelength conversion material to LED and/or laser based testing, wherein excitation light (from an LED or laser) is imparted on the wavelength converter or the wavelength conversion material. Subsequently, the conversion ratio of the wavelength converter and/or wavelength conversion material is measured over time. For example, the conversion ratio may be measured in real time, at regular time intervals, or at the start and end of the experiment, with the stability of the wavelength converter or wavelength conversion material correlating to the loss in conversion ratio after a given time interval.

With the foregoing in mind, in some embodiments the terms "high stability" and "highly stable" when used in connection with a wavelength converter mean that a wavelength converter and/or wavelength conversion material has a conversion ratio that is greater than or equal to about 90% (e.g., ≥95%, ≥99%, or even 100%) of its initial conversion ratio after a given time interval (e.g., 1000 minutes) when subject to such LED/laser based testing. Put in other terms, in some embodiments a
highly stable wavelength converter or wavelength conversion material is one that loses less than or equal to about 10% (e.g., ≤5%, ≤1%, or even about 0%) of its conversion efficiency after a given time interval (e.g., 1000 minutes) when subject to LED/laser based testing.

As noted in the background, various nitride phosphors have been identified as being suitable for use in wavelength converters for converting all or a portion of primary light incident thereon to light in the red portion of the visible region of the electromagnetic spectrum. Although such phosphors have proven useful, their performance may significantly degrade over time due to various factors, such as exposure to high temperature and/or high current intensity.

Europium (Eu) activated silicon nitrides are one important class of nitride phosphors that have been identified as being suitable for use in converting all or a portion of primary light incident thereon to light in the red region of the visible portion of the electromagnetic spectrum. Of such phosphors, $(Ca, Sr, Ba)_2Si_5N_8$:Eu phosphors have been identified as a particularly useful for lighting applications and especially for use as a wavelength conversion material in a wavelength converter.

With the foregoing in mind, the inventors have unexpectedly found that the physical properties of $(Ca, Sr, Ba)_2Si_5N_8$:Eu phosphors depend not only on their composition, but also on their particle and/or grain size. More particularly and as will be explained further below, the inventors unexpectedly found that wavelength converters that include coarse particles of one or more $(Ca, Sr, Ba)_2Si_5N_8$:Eu phosphors exhibit significantly better stability than wavelength converters that include fine particles of the same composition. This observation was found to extend to wavelength converters including consolidated particles of one or more (Ca, Sr, Ba)$_2$Si$_5$N$_8$:Eu phosphors and a matrix material, wherein the grain size of the $(Ca, Sr, Ba)_2Si_5N_8$:Eu phosphor(s) therein is greater than or equal to 5 μm (i.e., the consolidated wavelength converter included coarse grains of $(Ca, Sr, Ba)_2Si_5N_8$:Eu phosphor).

To illustrate the impact of particle size on the stability of a wavelength converter including particles of a $(Ca, Sr, Ba)_2Si_5N_8$:Eu phosphor, first and second sample powders containing $(Ca_{0.05}Sr_{0.43}Ba_{0.5})_2Si_5N_8$:2% Eu phosphor particles were prepared. The first and second sample powders were compositionally identical, but had a different median D50 particle size. Specifically, the first sample powder was a fine powder with a D50 particle size of 1.0 μm, whereas the second sample powder was a coarse powder with a D50 particle size of 15.9 μm, as measured by a CILAS® particle size analyzer. Scanning electron micrographs of the first and second sample powders are shown in FIG. 1, and demonstrate that the particles 101 of the second sample powder (D50=15.9 μm) were much larger than the particles 105 of the first sample powder ($D_{50}$=1.0 μm).

Tests were performed on the first and second sample powders to compare their properties. Specifically, to compare their quantum efficiency and other properties, each of the first and second sample powders was formed into a pressed powder plaque and subject to fluorescence testing. To compare their loss in conversion efficiency over time, a dispersion of each of the two sample powders was mixed with silicone and cast into the cavity of standard LED packages including a high power blue LED die, and their conversion ratio (ratio of converted power to unconverted (primary) power normalized to the start of the experiment) was measured as the LED was operated at 350 milliamps for a 1000 minute period. The first and second sample powders were also subject to high power laser testing, in which the samples were exposed to intensive laser radiation in the blue region of the electromagnetic spectrum over a period of time, during which their conversion ratio was monitored. Finally, thermal quenching testing was performed on the first and second samples to compare the integral of their emission spectrum (relative brightness) at room temperature and at 2250 Celsius (C). The results of the testing are provided in Table 1 below.

TABLE 1

Properties Comparison of $(Ca_{0.05}Sr_{0.43}Ba_{0.5})_2Si_5N_8$: 2% Eu Phosphor Particles of different median particle diameter ($D_{50}$)

| Test | Parameter | Example 1 | Example 2 |
|---|---|---|---|
| Particle size (CILAS ® 1064) | $D_{50}$ | 1.0 μm | 15.9 μm |
| | $D_{90}$ | 4.3 μm | 28.0 μm |
| | $B_{80}$ = $(D_{90} - D_{10})/D_{50}$ | 3.8 | 1.4 |
| Fluorescence Measurement | QE | 79.5% | 84.7% |
| | R450-470 | 44.5% | 14.1% |
| | CIE-x | $0.600_{PP}$/ $0.589_{SG}$ | $0.617_{PP}$/ $0.599_{SG}$ |
| | CIE-y | $0.399_{PP}$/ $0.409_{SG}$ | $0.382_{PP}$/ $0.400_{SG}$ |
| | FWHM | 85.9 nm | 86.7 nm |
| | Ldom | $594.0_{PP}$/ $592.6_{SG}$ | $597.9_{PP}$/ $594.3_{SG}$ |
| LED-Maintenance (1000 minutes) | Change in Conversion Ratio | −5.0% | −0.5% |
| High-power laser test (HPLT; 120 minutes) | Change in Conversion Ratio | −13.5% | 5.8% |
| Thermal Quenching (TQ) | rel. brightness | 83.6% | 83.2% |
| | Delta Ldom | −6 nm | −5 nm |
| | Delta LSchwerp. | −7.2 nm | −4.9 nm |
| | Delta x | −0.035 | −0.027 |
| | Delta y | 0.034 | 0.026 |
| | FWHM(RT) | 86.5 nm | 86.3 nm |
| | FWHM(225° C.) | 96.7 nm | 95.0 nm |

Figure 2:
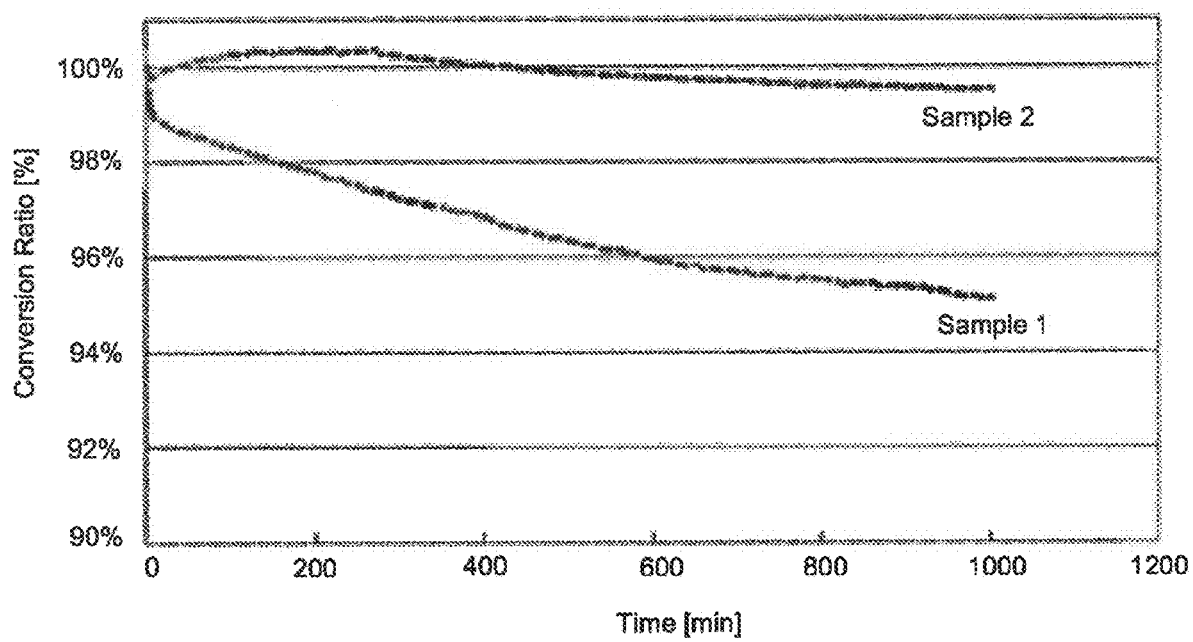
FIG. 2 is a plot of conversion ratio versus time of the sample powers of FIG. 1 as measured by LED-maintenance testing.

In which: QE is Quantum Efficiency; CIE-x and CIE-y are color space coordinates; FWHM is full width half maximum (spectral width); Ldom is the dominant wavelength; "PP" is phosphor plaque" "SG" is single grain; relative brightness is the photon integral of the emission signal at 225° C. divided by the photon integral of the emission signal at room temperature; nm is nanometers; Delta LDom is the difference of the dominant wavelength (derived from the emission spectrum) at 225° C. versus room temperature; Delta Lschwerp is the different of the centroid wavelength (derived from the emission wavelength at 225° C. versus room temperature; Delta x and y are the difference in CIE x and y coordinates, respectively, at 225° C. versus room temperature; FWHM (RT) is the spectral width at room temperature; and FWHM (225° C.) is the spectral width at 225° C. The conversion ratio of the first and second sample powders versus time as measured by LED-maintenance testing is also shown in FIG. 2.

As can be seen, the tests demonstrate that the second (coarse) sample powder ($D_{50}$=15.9 μm) was significantly more stable than the first (fine) sample powder ($D_{50}$=1.0 μm). In particular, the conversion ratio of a wavelength converter including the first sample powder as measured by LED maintenance testing decreased by 5% (i.e., to about 95%) at 1000 minutes, whereas the conversion ratio of a wavelength converter including the second sample powder decreased by only 0.5% (i.e., to 99.5%) under the same test. The HPLT test results further support that the second (coarse) sample powder was more stable than the first (fine) sample powder. That is, the tests show that the second sample powder was highly stable when subject to LED and laser based testing over a 1000 minute interval.

Notably, the fluorescence and thermal quenching properties of the second sample powder were comparable to that of the first sample powder. Without wishing to be bound by theory, it is believed that the improved stability of second sample powder is attributable to crystallinity of the coarse $(Ca_{0.05}Sr_{0.43}Ba_{0.5})_2Si_5N_8$:2% Eu phosphor particles therein, which is believed to be better than the crystallinity of the fine $(Ca_{0.05}Sr_{0.43}Ba_{0.5})_2Si_5N_8$:2% Eu phosphor particles in the first sample powder.

Accordingly, one aspect of the present disclosure relates to wavelength converters that include coarse particles and/or grains of one or more $(Ca, Sr, Ba)_2Si_5N_8$:Eu phosphors encapsulated in a matrix material. As will be described in detail below, in some embodiments the wavelength converters described herein include coarse $(Ca, Sr, Ba)_2Si_5N_8$:Eu phosphor particles that are encapsulated in a matrix material, such as an organic matrix. In other embodiments the wavelength converters described herein are in the form of a consolidated (e.g., sintered) article that includes coarse grains of one or more $(Ca, Sr, Ba)_2Si_5N_8$:Eu phosphors, either alone or combination with matrix material.

Figure 3:
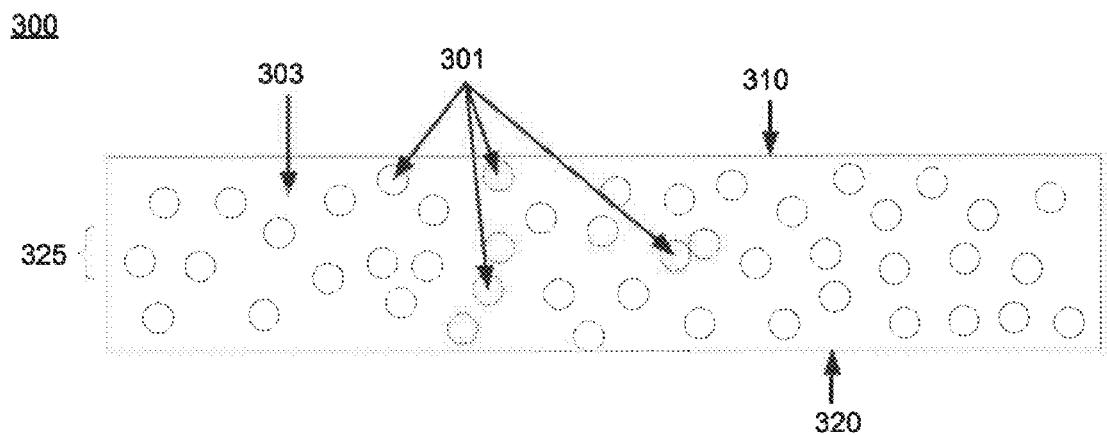
FIG. 3 depicts a generalized structure of one example of a wavelength converter that includes particles of a wavelength conversion material consistent with the present disclosure.

FIG. 3 depicts a generalized structure of one example of a wavelength converter that includes particles of a wavelength conversion material encapsulated in a matrix material consistent with the present disclosure. As shown, the wavelength converter 300 includes coarse particles 301 of one or more wavelength conversion materials encapsulated in a matrix 303. In this context, it should be understood that the coarse particles 301 and the matrix 303 have not been subject to a consolidation (e.g., sintering) step. Rather, the coarse particles 301 are simply encapsulated within matrix 303. Such encapsulation may be accomplished in any suitable manner, such as but not limited to by mixing coarse particles 301 with a precursor of matrix 303, after which the precursor of matrix 303 may be cured. Alternatively or additionally, coarse particles 301 may be added to a precursor of matrix 303 such that their distribution is controlled, as described later.

Any suitable matrix material may be used as matrix 303. Without limitation, in some embodiments matrix 303 is formed from or includes an optically transparent matrix material. Without limitation, in some embodiments the matrix 300 is configured to transmit greater than or equal to about 80%, greater than or equal to 90%, greater than or equal to about 95%, greater than or equal to about 99%, or even about 100% of primary light incident on wavelength converter 300 (e.g., from an external light source) and of secondary light produced by conversion of primary light by the coarse particles 301. In some embodiments the material(s) used as matrix 303 are selected such that they are compatible with the coarse particles 301.

Non-limiting examples of suitable materials that may be used as matrix 300 include polymers such as an optical quality silicone, epoxy, acrylic (e.g., polyacrylate, polymethacrylate, etc.), polysilazane, polycarbonate, combinations thereof, and the like. Without limitation, in some embodiments matrix 300 is silicone.

The coarse particles 301 are coarse particles of one or more wavelength conversion materials. In that regard, the coarse particles 301 may be formed from any suitable wavelength conversion material or combination of wavelength materials, so long as the D50 particle size of the coarse particles 301 is greater than or equal to 5 μm. In some embodiments the coarse particles 301 are coarse particles of a wavelength conversion material that is suitable for converting incident primary light of a first wavelength or wavelength range (e.g., incident blue light) to secondary light of a second wavelength or wavelength range (e.g., red light). More particularly, in some embodiments the coarse particles 301 are coarse particles of a red nitride phosphor. And without limitation, in some embodiments the coarse particles 301 are coarse particles of a $(Ca, Sr, Ba)_2Si_5N_8$:Eu phosphor or a mixture of two or more $(Ca, Sr, Ba)_2Si_5N_8$:Eu phosphors. And in still further embodiments, the coarse particles 301 are coarse particles of one or more highly stable $(Ca, Sr, Ba)_2Si_5N_8$:Eu phosphors In instances where the coarse particles 301 include a $(Ca, Sr, Ba)_2Si_5N_8$:Eu phosphor, it is noted that the relative amounts of calcium (Ca), strontium (Sr), barium (Ba) and the concentration of europium (Eu) in such phosphors can impact their emission color as well as other properties such as thermal quenching and stability. It may therefore be desirable to select the amounts of Ca, Sr, Ba, and Eu in a $(Ca, Sr, Ba)_2Si_5N_8$:Eu phosphor used as or in the coarse particles 301, so as to achieve desired properties.

In that regard, in some embodiments the coarse particles 301 include or are coarse particles of one or more $(Ca, Sr, Ba)_2Si_5N_8$:Eu phosphors of the general formula $(Ca_x, Sr_y, Ba_z)_2Si_5N_8$, wherein d is the amount of Eu in atomic percent, and the following relationships are met: $0<x<1$; $0<y<1$; $0<z<1$; $x+y+z=1$; and $0<d<10$. In further non-limiting embodiments, the coarse particles 301 include or are coarse particles of one or more $(Ca, Sr, Ba)_2Si_5N_8$:Eu phosphors of the above formula, wherein the following relationships are met: $0<x\leq0.2$; $0<y\leq0.6$; $0<z<1$; $x+y+z=1$; and $0.5\leq d\leq8$. In still further non-limiting embodiments, the coarse particles 301 include or are coarse particles of one or more $(Ca, Sr, Ba)_2Si_5N_8$:Eu phosphors of the above formula, wherein the following relationships are met: $0<x\leq0.1$; $0<y\leq0.5$; $0<z<1$; $x++z=1$; and $1\leq d\leq6$. And in still further non-limiting embodiments, the coarse particles 301 include or are coarse particles of one or more $(Ca, Sr, Ba)_2Si_5N_8$:Eu phosphors of the above formula, wherein the following relationships are met: $0.03<x\leq0.07$; $0.4<y\leq0.5$; $0<z<1$; $x+y+z=1$; and $1.5\leq d\leq5$.

The relative amount of coarse particles 301 and the matrix 303 can vary widely depending on the application and desired properties. For example, the amount of coarse particles 301 may impact the amount of primary light that is converted to secondary light by the wavelength converter 300. Moreover, the amount of coarse particles 301 can impact the viscosity of a precursor of the wavelength converter 300, as well as the thermal conductivity of the wavelength converter 300. It may therefore be desirable to select the relative amount of the coarse particles 301 and the matrix 303 to achieve desired characteristics.

In some embodiments the coarse particles 301 are present in an amount ranging from greater than 0 to about 30% by weight, such as from greater than 0 to about 20% by weight, or even from greater than 0 to about 15% by weight, relative to the total weight of wavelength converter 300. Without limitation, in some embodiments the coarse particles 301 are coarse particles of one or more $(Ca, Sr, Ba)_2Si_5N_8$:Eu phosphors, and are present in amount ranging from about 10 to about 15% by weight, relative to the total weight of the wavelength converter 300.

Similarly, the amount of matrix 303 can vary considerably, and any suitable amount of matrix 303 may be used. Without limitation, in some embodiments the matrix 303 is present in an amount ranging from less than 100% to greater than about 70% by weight, such as from less than 100% to greater than about 80%, or even less than 100% to greater than about 85% by weight, relative to the total weight of the wavelength converter 300. Without limitation, in some embodiments the matrix 303 is present in an amount of about 80 to about 85% by weight, relative to the total weight of the wavelength converter 300.

In further non-limiting embodiments, the wavelength converter 300 includes about 10 to about 15% by weight of coarse particles 301, and about 80 to about 85% by weight of matrix 303, wherein the coarse particles 301 are coarse particles of one or more (Ca, Sr, Ba)$_2$Si$_5$N$_8$:Eu phosphors, and the matrix 303 is an optical grade silicone. And in still further non-limiting embodiments, the wavelength converter 300 includes about 15% by weight of coarse particles 301, and about 85% by weight of matrix 303, wherein the coarse particles 301 are coarse particles of one or more (Ca, Sr, Ba)$_2$Si$_5$N$_8$:Eu phosphors, and the matrix 303 is an optical grade silicone.

As noted previously, the inventors observed that the particle size of (Ca, Sr, Ba)$_2$Si$_5$N$_8$:Eu phosphor particles impact their stability when subject to various tests, such as LED maintenance and high power laser testing. More particularly, the inventors observed that as the median (D$_{50}$) particle size of a (Ca, Sr, Ba)$_2$Si$_5$N$_8$:Eu phosphor increased above 5 microns, the stability of the phosphor particles when subject to such testing also increased, relative to fine grain particles of the same phosphor composition.

With that in mind, in some embodiments the coarse particles 301 in some embodiments are coarse (Ca, Sr, Ba)$_2$Si$_5$N$_8$:Eu phosphor particles with a median (D50) particle size greater than or equal to 5 µm. Without limitation, in some embodiments the coarse particles 301 are coarse (Ca, Sr, Ba)$_2$Si$_5$N$_8$:Eu phosphor particles with a median (D50) particle size greater than or equal to about 7 µm, greater than or equal to about 12 µm, greater than or equal to about 15 µm, or even greater than or equal to about 20 µm. Without limitation, in some embodiments the coarse particles 301 are coarse particles of one or more (Ca, Sr, Ba)$_2$Si$_5$N$_8$:Eu phosphors of the above noted formula (e.g., where $0.03 < x \leq 0.07$; $0.4 < y \leq 0.5$; $0 < z < 1$; $x+y+z=1$; and $1.5 \leq d \leq 5$), and have a median (D50) particle size greater than or equal to about 15 µm.

The distribution of coarse particles 301 within the matrix 303 may vary considerably, and may impact the performance of the wavelength converter 300. Therefore while FIG. 3 depicts one example of a wavelength converter 300 in which the coarse particles 301 are homogenously distributed within the matrix 303, it should be understood that such illustration is for the sake of example and that the distribution of the coarse particles 301 may differ from the illustrated distribution. Indeed the present disclosure envisions embodiments in which the coarse particles 301 are distributed homogenously, inhomogenously, randomly, in a defined distribution, and/or in a pattern within the matrix 303.

For example, in some embodiments the coarse particles may be concentrated at or near a first side 310 of wavelength converter 300, a second side 320 of wavelength converter 300, or at both the first and second sides 310, 320 of the wavelength converter 300. Alternatively or additionally, the concentration of coarse particles 301 may vary or remain constant over the thickness of the wavelength converter 300. For example, the concentration of the coarse particles 301 may be relatively high proximate the first side 310 of wavelength converter, and may gradually decrease (e.g., in a gradient) as one moves from the first side 310 towards the second side 320. Alternatively, the concentration of the coarse particles 301 may be relatively high proximate a middle portion 325 of the wavelength converter 300, and may be relatively low proximate the first and second sides 310, 320 thereof. In such instances, the concentration of the coarse particles 301 in some embodiments may decrease in a gradient from the middle portion 325 to the first and second sides 310, 320. Still further, in some embodiments the concentration of the coarse particles 301 may be relatively high proximate the first and second sides 310, 320, and may decrease in a gradient from the first and second sides 310, 320 towards the middle portion 325.

While the above described wavelength converters are useful and may exhibit improved stability due to their use of coarse phosphor particles, their use of a polymeric matrix such as a silicone or an epoxy can be limiting in certain circumstances. For example, exposing such wavelength converters to high temperatures (e.g., about 90 to about 200° C.) that may be encountered in wavelength converted LED applications can cause the matrix material to degrade. It may therefore be necessary to artificially limit the light output of an LED chip to ensure that the temperature of the wavelength converter 300 (or, more particularly, the matrix 303) stays within tolerable limits. Failure to maintain the temperature of the wavelength converter 300 within the tolerance of the matrix 303 may lead to thermal and/or oxidative breakdown of the matrix 303, potentially leading to premature failure of the LED or other light source in which the wavelength converter 300 is included. Alternatively, this issue may be addressed by the use of an inorganic wavelength converter.

Another aspect of the present disclosure therefore relates to inorganic wavelength converters that include one or more coarse grain wavelength conversion materials. As used herein, the term "inorganic wavelength converter" means a wavelength converter that does not include an organic matrix material, such the polymeric matrix materials noted above as being suitable for use as the matrix 300. Rather, the inorganic wavelength converters described herein include an inorganic matrix and one or more coarse grain (inorganic) wavelength conversion materials. More specifically, the inorganic wavelength converters described herein are consolidated (e.g., sintered or otherwise thermally processed) articles that are formed from particles of an inorganic matrix material and particles of an inorganic wavelength conversion material. Without limitation, in some embodiments the inorganic wavelength converters described herein are fully inorganic, i.e., they do not contain any organic material.

Figure 4:
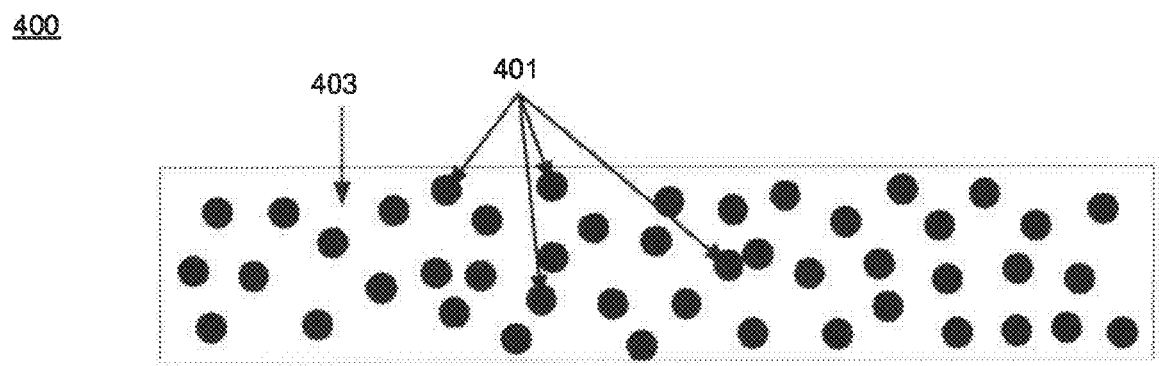
FIG. 4 depicts a generalized structure of one example of an inorganic wavelength converter consistent with the present disclosure.

Reference is therefore made to FIG. 4, which depicts a generalized structure of one example of an inorganic wavelength converter 400 consistent with the present disclosure. As shown, the inorganic wavelength converter 400 includes coarse grains 401 of a wavelength conversion material within an inorganic matrix 403.

The function and composition of the grains 401 of wavelength conversion material is the same as that of the coarse particles 301 described above, and therefore is not described in detail again in the interest of brevity. One notable exception is that unlike the coarse particles 301 (which are encapsulated by the matrix 303), the coarse grains 401 are coarse crystalline grains of a wavelength conversion material, at least a portion of which are bonded by sintering, calcining, or other thermal processing to the matrix 403.

In some embodiments the coarse grains 401 are coarse grains of a phosphor material that is suitable for converting incident primary light of a first wavelength or wavelength range (e.g., blue primary light) to secondary light of a second wavelength or wavelength range (e.g., red light). In some instance, the coarse grains 401 are coarse grains of a red nitride phosphor, such but not limited to a (Ca, Sr, Ba)$_2$Si$_5$N$_8$:Eu phosphor of the above noted composition. In such instances the composition of the (Ca, Sr, Ba)$_2$Si$_5$N$_8$:Eu phosphor grains may be the same as the composition noted above as being suitable for use as the coarse particles 301.

With that in mind, in some embodiments the coarse grains 401 in some embodiments are coarse (Ca, Sr, Ba)$_2$Si$_5$N$_8$:Eu phosphor grains with a median (D50) grain size greater than or equal to 5 µm. Without limitation, in some embodiments the coarse grains 401 are coarse (Ca, Sr, Ba)$_2$Si$_5$N$_8$:Eu phosphor grains with a median (D50) grain size greater than or equal to about 7 µm, greater than or equal to about 12 µm, greater than or equal to about 15 µm, or even greater than or equal to about 20 µm. Without limitation, in some embodiments the coarse grains 401 are coarse grains of one or more (Ca, Sr, Ba)$_2$Si$_5$N$_8$:Eu phosphors of the above noted formula (e.g., where $0.03<x≤0.07$; $0.4<y≤0.5$; $<z<1$; $x+y+z=1$; and $1.5≤d≤5$), and have a median (D50) grain size greater than or equal to about 15 µm.

A wide variety of materials may be used as the inorganic matrix 403, provided they do not include an organic (e.g., polymeric material). Without limitation, in some embodiments the inorganic matrix 403 is an optically transparent inorganic material, i.e., an inorganic material which transmits greater than or equal to about 80% (e.g., greater than or equal to about 90, 95, 99, or even 100%) of incident primary light (e.g., from an external source) and/or secondary light produced by coarse grains 401. Alternatively or additionally, inorganic matrix 403 is formed from materials that are compatible with the coarse grains 401.

Non-limiting examples of suitable materials that may be used as inorganic matrix 403 include optically transparent metal nitrides (e.g., aluminum nitride (AlN)), metal oxynitrides (e.g., aluminum oxynitride (AlON), Ca—SiAlON), metal oxides (e.g., sapphire (Al$_2$O$_3$), metal activated silicon nitrides where the concentration of metal activator is less than 2% (e.g., (Ca, Sr, Ba)$_2$Si$_5$N$_8$:Eu, wherein the concentration of Eu is less than 1.5 atomic %, less than or equal to about 1.0 atomic %, less than or equal to about 0.5 atomic %, or less than or equal to about 0.25 atomic %), undoped silicon nitrides such as (Ca, Sr, Ba)$_2$Si$_5$N$_8$, (i.e., where the concentration of metal activator is 0 atomic % or approximately 0 atomic %), glasses, nitrido-alumino-silicates (e.g., (Ca, Sr)AlSiN$_3$:Eu, combinations thereof, and the like.

Without limitation, in some embodiments the inorganic matrix 403 is formed from or includes AlN, Ca—SiAlON, (Ca, Sr, Ba)$_2$Si$_5$N$_8$:Eu, wherein the concentration of Eu is less than 1.5 atomic %, or (Ca, Sr, Ba)$_2$Si$_5$N$_8$ (i.e., wherein the concentration of Eu is 0). In specific non-limiting embodiments, the inorganic matrix 403 is formed (Ca, Sr, Ba)$_2$Si$_5$N$_8$ and the coarse grains 401 are formed from (Ca, Sr, Ba)$_2$Si$_5$N$_8$:Eu, wherein the ratio of Ca, Sr, and Ba in the inorganic matrix 403 and the coarse grains 403 is the same or substantially the same.

The relative amount of coarse grains 401 and the inorganic matrix 403 can vary widely depending on the application and desired properties. For example, the amount of coarse grains 401 may impact the amount of primary light that is converted to secondary light by the inorganic wavelength converter 400. Moreover, the amount of coarse grains 401 can impact the thermal conductivity of the inorganic wavelength converter 400. It may therefore be desirable to select the relative amount of the coarse grains 401 and the matrix 403 to achieve desired characteristics.

In some embodiments the coarse grains 401 are present in an amount ranging from greater than 0 to about 30% by weight, such as from greater than 0 to about 20% by weight, or even from greater than 0 to about 15% by weight, relative to the total weight of the inorganic wavelength converter 400. Without limitation, in some embodiments the coarse grains 401 are coarse grains of one or more (Ca, Sr, Ba)$_2$Si$_5$N$_8$:Eu phosphors, and are present in amount ranging from about 10 to about 15% by weight, relative to the total weight of the inorganic wavelength converter 400.

Similarly, the amount of the inorganic matrix 403 can vary considerably, and any suitable amount of inorganic matrix 403 may be used. Without limitation, in some embodiments the inorganic matrix 403 is present in an amount ranging from less than 100% to greater than about 70% by weight, such as from less than 100% to greater than about 80%, or even less than 100% to greater than about 85% by weight, relative to the total weight of the inorganic wavelength converter 400. Without limitation, in some embodiments the inorganic matrix 403 is present in an amount of about 80 to about 85% by weight, relative to the total weight of the inorganic wavelength converter 400.

In further non-limiting embodiments, the inorganic wavelength converter 400 includes about 10 to about 15% by weight of coarse grains 401, and about 80 to about 85% by weight of inorganic matrix 403, wherein the coarse grains 401 are coarse grains of one or more (Ca, Sr, Ba)$_2$Si$_5$N$_8$:Eu phosphors of the above noted formula, and the inorganic matrix 403 is AlN, AlON, Ca—SiAlON, or (Ca, Sr, Ba)$_2$Si$_5$N$_8$:Eu (where the concentration of Eu is less than 2%), or (Ca, Sr, Ba)$_2$Si$_5$N$_8$ (where the concentration of Eu is 0). And in still further non-limiting embodiments, the inorganic wavelength converter 400 includes about 15% by weight of coarse grains 401, and about 85% by weight of inorganic matrix 403, wherein the coarse grains 401 are coarse grains of one or more (Ca, Sr, Ba)$_2$Si$_5$N$_8$:Eu phosphors of the above noted formula, and the matrix 403 is (Ca, Sr, Ba)$_2$Si$_5$N$_8$ (where the concentration of Eu is 0).

Figure 5:
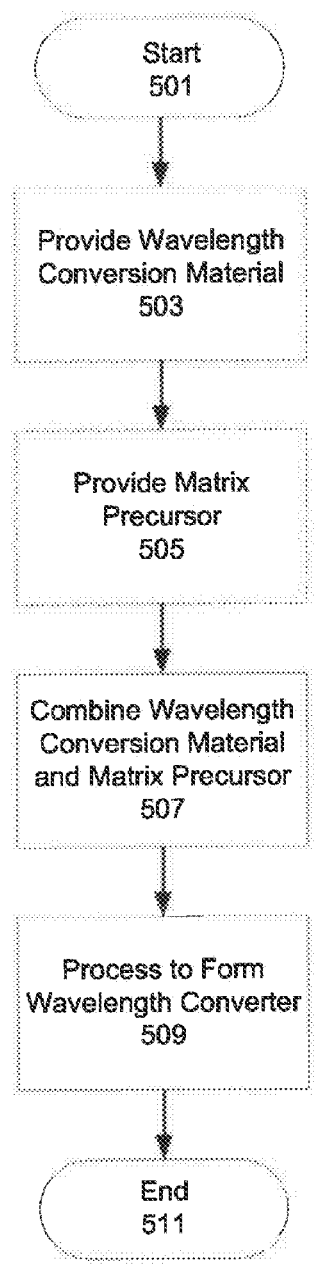
FIG. 5 is a flow chart of example operations of one example method of forming a wavelength converter consistent with the present disclosure.

Another aspect of the present disclosure relates to methods of forming wavelength converters consistent with the present disclosure. In that regard reference is made to FIG. 5, which is a flow chart of example operations of one example method of forming a wavelength converter consistent with the present disclosure. As shown, the method 500 begins at block 501. Pursuant to optional block 503, a wavelength conversion material is optionally provided. In instances where the wavelength converter to be formed is one in which an organic matrix is used, the wavelength conversion material provided pursuant to optional block 503 may be in the form of coarse particles of a wavelength conversion material, such as but not limited to coarse particles of one or more (Ca, Sr, Ba)$_2$Si$_5$N$_8$:Eu phosphor particles.

In instances where the wavelength converter to be formed is an inorganic wavelength converter, the wavelength conversion material provided pursuant to optional block 503 may be in the form of a precursor of coarse grains of a wavelength conversion material. The precursor of the coarse grains in some embodiments may be coarse particles of the wavelength conversion material, as described previous in connection with the preparation of a wavelength converter that includes an organic matrix. Alternatively or additionally, in some embodiments the precursor of the coarse grains of wavelength conversion material may be particles of wavelength conversion material that, when subject to thermal processing (e.g., sintering, calcining, etc.), result in the formation of coarse grains of wavelength conversion material.

In any case once a wavelength conversion material is provided pursuant to optional block 503 (or if provision of such the wavelength conversion material is not required), the method may proceed to optional block 505, pursuant to which a matrix precursor is optionally provided. In instances where an organic matrix is to be used the matrix precursor may be a precursor to an organic matrix, such as a pre-polymer or other precursor of the organic matrix materials noted above as being suitable for use as matrix 303 prepolymer that may be cured and/or polymerized to form the organic matrix. Alternatively in instances where an inorganic matrix is to be used, the matrix precursor may be in the form of fine particles of an inorganic material, such as fine particles of the inorganic materials noted above as being suitable for use as inorganic matrix 403. Alternatively, the matrix precursor of an inorganic matrix may include fine particles of an inorganic matrix material in an organic binder, wherein the organic binder is removed (e.g., by pyrolysis) when the matrix precursor and precursor of the coarse grains are subject to thermal processing (e.g., sintering).

Following optional block 505 (or if optional block 505 is not required), the method may proceed to block 507, pursuant to which the wavelength conversion material and the matrix precursor are combined. In instances where an organic matrix is to be used, the operations of block 507 may involve mixing or otherwise combining the wavelength conversion material (e.g., coarse particles of one or more (Ca, Sr, Ba)$_2$Si$_5$N$_8$:Eu phosphor particles) with the matrix precursor. Alternatively or additionally, the matrix precursor may be deposited as a layer (e.g., on a substrate), after which particles of a wavelength conversion material may be added, e.g., to one or more sides thereof.

In instances where an inorganic wavelength converter is to be formed, the matrix precursor may be in the form of inorganic particles of matrix material (optionally dispersed in an organic binder). In such instances the operations of block 507 may include combining the particles of inorganic matrix material with (e.g., coarse) particles of a wavelength conversion material. This may be accomplished, for example, by mixing the particles of inorganic matrix material and particles of wavelength conversion material together so as to substantially mix the particles of matrix material and wavelength conversion material with one another. Alternatively in instances where the inorganic matrix precursor includes a binder, (coarse) particles of a wavelength conversion material may be dispersed within the binder and/or coated on a surface of the binder.

Without limitation, the precursors provided pursuant to blocks 503 and 505 in some embodiments are in the form of coarse particles/grains (503) of wavelength conversion material, and fine particles of precursor to an inorganic matrix (505). One reason for the use of coarse particles/grains wave wavelength conversion material in combination with fine matrix precursor particles is to facilitate thermal processing of the materials into a useful wavelength converter. In that regard, it is noted that coarse grains of wavelength conversion material (such as those described above) can be practically difficult to sinter into a bulk ceramic. In contrast, the fine matrix precursor particles may be selected from a material that more easily sintered than the coarse particles of wavelength conversion material. As a result, combining the fine matrix precursor particles with the coarse particles/grains of wavelength conversion material can result in a mixture that may be more easily sintered into a bulk ceramic article than the particles/grains of the wavelength conversion material alone.

Following the operations of block 507 the method may proceed to block 509 pursuant to which processing may be performed to produce a wavelength converter consistent with the present disclosure. In instances where an organic matrix material is used, the operations pursuant to block 509 may include curing the matrix precursor material so as to for an organic matrix that encapsulates coarse particles of wavelength conversion material, wherein the particles of wavelength conversion material are present in a desired distribution.

In instances where an inorganic wavelength converter is to be formed, however, the operations of block 509 may include other operations. For example, an inorganic wavelength converter may be formed by subjecting the combination of the wavelength conversion material and matrix precursor particles/grains produced pursuant to block 507 to thermal processing (e.g., sintering, calcining, etc.), so as to result in an inorganic wavelength converter that is in the form of a consolidated (e.g., bulk ceramic) article.

By way of example, an inorganic wavelength converter may be formed by combining precursor particles of an inorganic matrix with precursor particles of a (Ca, Sr, Ba)$_2$Si$_5$N$_8$:Eu phosphor pursuant to block 507 and, pursuant to block 509, forming the resulting mixture into an article such as a disk or other shape (e.g., by compressing the mixture in a die), and subjecting the article sintering (e.g. spark plasma sintering) to form a consolidated inorganic wavelength converter. As one non-limiting example, an inorganic wavelength converter may be formed by combining appropriate amounts of fine matrix precursor particles and coarse particles of a wavelength conversion material (e.g., one or more (Ca, Sr, Ba)$_2$Si$_5$N$_8$:Eu phosphor), placing the resultant mixture in a die, and sintering the mixture via spark plasma sintering or another suitable sintering process. Of course, such a method is elicited for the sake of example only, and other methods may be used to form the inorganic wavelength converters described herein. As shown, the method ends at block 511.

Figure 6A:
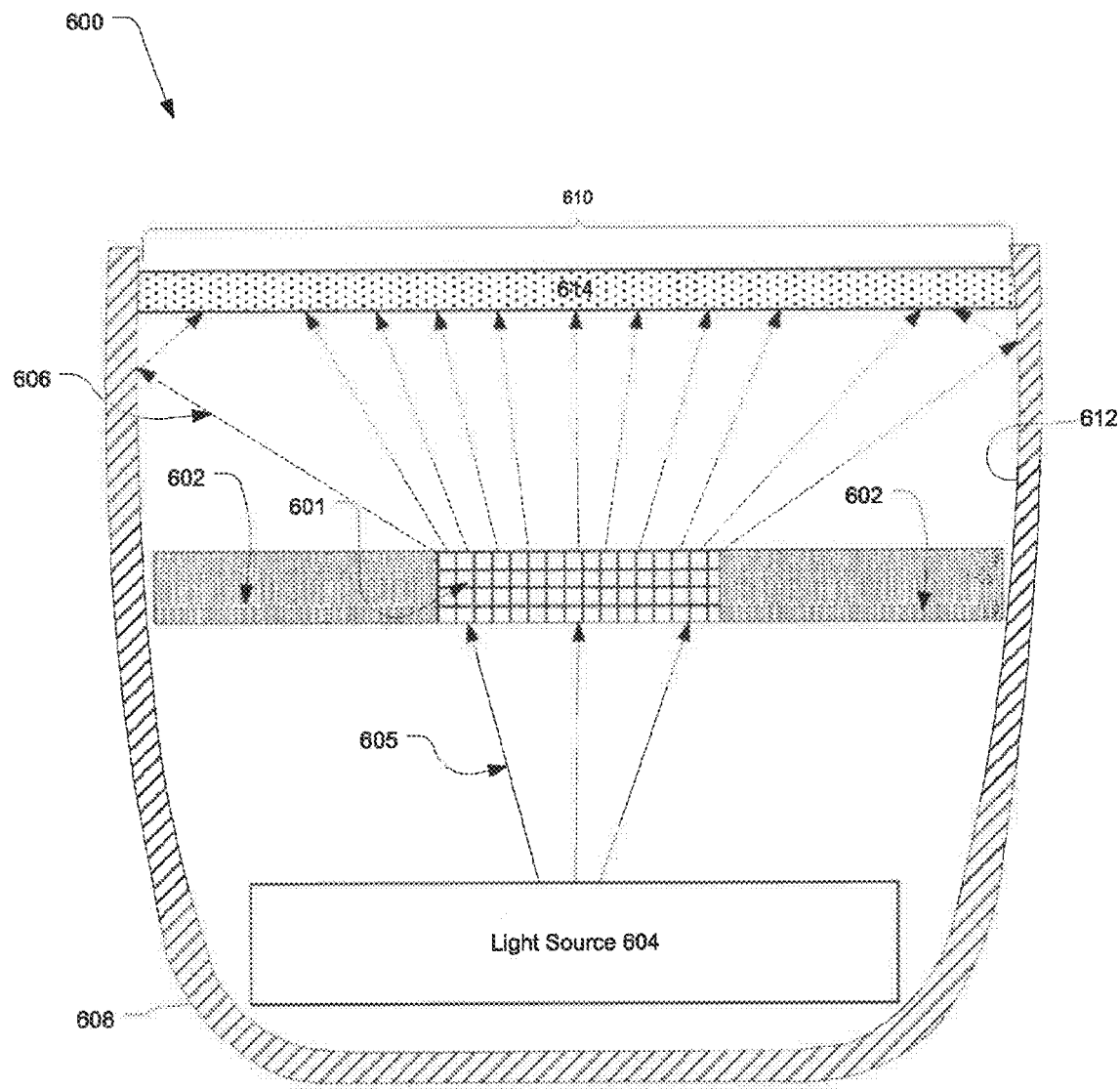
FIG. 6A illustrates one example configuration of a lighting device consistent with the present disclosure.

Another aspect of the present disclosure relates to lighting devices that include at least one of the wavelength converters described herein. FIG. 6A illustrates one example configuration of such a lighting device. As shown, the device 600 includes a light source 604 and a wavelength converter 601 consistent with the present disclosure disposed within a housing 608. In this embodiment, the wavelength converter 601 is disposed within a through hole in a reflector 602. The lower surface of the wavelength converter 601 is shown in FIG. 6A as being oriented generally in parallel with a light emitting (upward facing) surface of the light source 604. Such orientation is not required, however, and the light source 604 and the wavelength converter 601 may be oriented in any suitable manner. Furthermore, while the light source 604 and the wavelength converter 601 are shown as having respective upper and lower surfaces that are smooth, it should be understood that such surfaces may be roughened, structured, etc., depending on the desired optical out-coupling and in-coupling.

The light source 604 may be any light source capable of emitting primary light. Non-limiting examples of such light sources include solid state sources such as LEDs (e.g., nitride III-V LEDs such as an InGaN LED) and laser diodes. In any case, the light source(s) used in the lighting devices described herein may be coupled to a light guide (e.g., a light pipe) to form a surface emitter. Furthermore, while the device 600 is shown as including a single light source 604, it should be understood that the lighting devices described herein may include an array of light sources.

In operation the light source 604 may emit primary light 605, which may be described by a number of parameters such as a peak or dominant wavelength, color coordinates, intensity etc. The primary light 605 may be incident on the lower surface of the wavelength converter 601. The wavelength converter 601 may absorb the primary light and be excited to a higher energy state. When the excited wavelength converter 601 returns to a lower energy state, it may emit secondary light 606. In this way, the primary light 605 incident on the wavelength converter 601 may be converted to the secondary light 606.

The wavelength converter 601 may be configured to have a desired level of conversion, i.e., to convert a desired amount of incident primary light to secondary light. In some embodiments, the wavelength converter 601 exhibits a conversion greater than or equal to 50%, such as about 50 to about 100%, about 60 to about 99%, about 70 to about 98%, about 80 to about 97%, or even about 85 to about 96%. Preferably, the conversion of the wavelength converter 601 is greater than 95%.

The reflector 602 can function to reflect incident primary and/or secondary light. With respect to the former, the reflector 602 may reflect incident primary light in such a way that it is incident on and or passes through the wavelength converter 601. In that way, the reflector 602 can increase the opportunity for the wavelength converter 601 to absorb and convert primary light to secondary light, thus increasing conversion efficiency.

The secondary light emitted by the wavelength converter 601 may not always be emitted toward the aperture 610 of the housing 608. For example, secondary light may be emitted to either side of the wavelength converter 601 or back towards the light source 604 (backscatter). If such side scattered and back scattered light is not redirected towards the aperture, it may be absorbed or otherwise lost, resulting in a loss of light output from device 600. To address that issue the reflector 602 may be configured to have high reflectance with respect to primary light that is emitted by the light source 604 and secondary light that is emitted by the wavelength converter 601. In the embodiment shown in FIG. 6A, for example, the reflector 602 is disposed around the edge(s) of the wavelength converter 601. As a result, the reflector 602 may reflect side scattered secondary light emitted by converter 601, thus increasing the opportunity for such light to escape device 600.

Figure 6B:
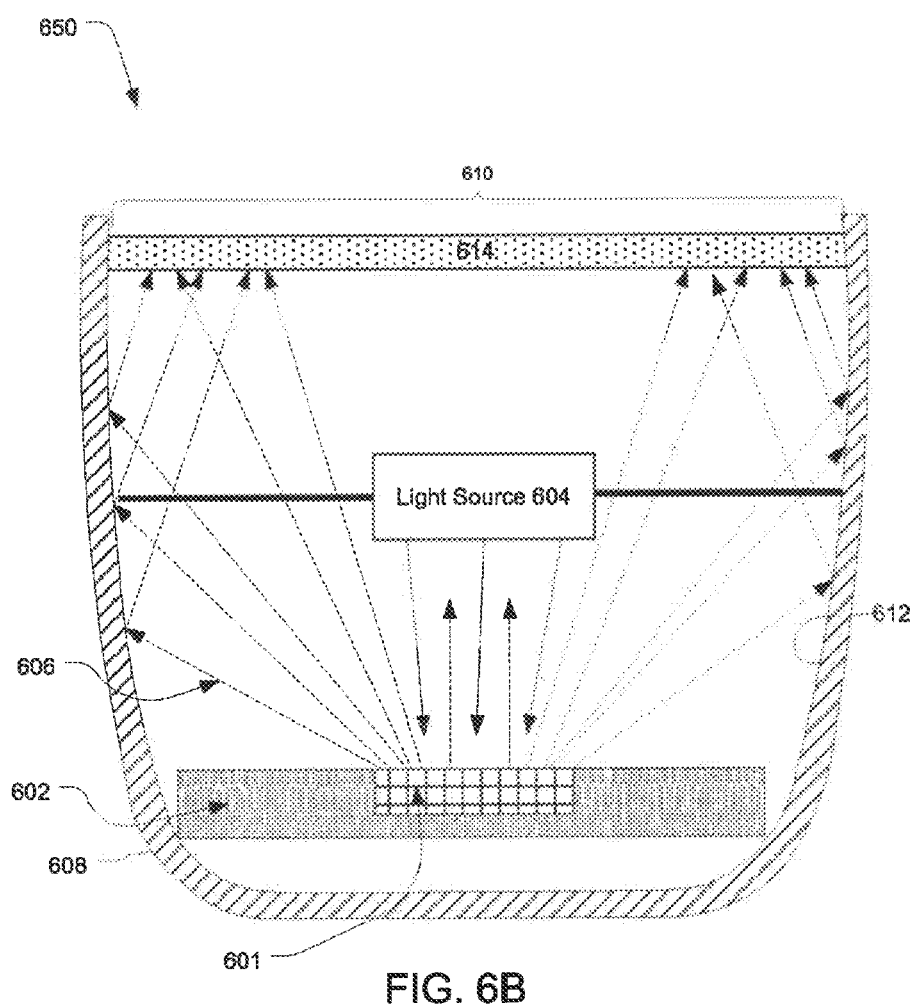
FIG. 6B illustrates another example of a lighting device configuration in accordance with the present disclosure.

FIG. 6B illustrates another exemplary lighting device configuration in accordance with the present disclosure. With the exception of the location of the wavelength converter 601 and the light source 604, the parts of device 650 in FIG. 6B are identical to those shown in FIG. 6A. Thus, the nature and function of such common parts is not repeated. Of course, it should be understood that this illustration is exemplary only, and the light source 604 and the wavelength converter 601 may be oriented in any desired fashion.

In FIG. 6B, the wavelength converter 601 is disposed within a recess in the reflector 602. As such, only one surface of the wavelength converter 601 is exposed. In this embodiment the exposed surface of the wavelength converter 601 is oriented to face a light emitting surface of the light source 604. As a result, secondary light emitted by the wavelength converter 601 may be emitted in a direction other than the direction of the aperture 610 of device 650, e.g., towards light source 604.

The devices 600, 650 can further include a reflector 612, which may be integral to or separate from the housing 608. Thus, for example, the reflector 612 may take the form of one of or more reflective coatings disposed on an interior surface of housing 608. In general, the reflector 612 may be configured to reflect light such that a desired illumination pattern, such as a down light, flood light, etc., may be emitted from the devices 600, 650. The reflector 612 may also be configured to re-direct backscattered primary and/or secondary light in a desired manner. For example, the reflector 612 may include a surface having high reflectivity for backscattered primary and/or secondary light.

While FIGS. 6A and 6B illustrate lighting devices 600, 650 in which a wavelength converter 601 is positioned away from the surface of light source 604, such a configuration is not required. For example, in some embodiments the wavelength converter 601 is positioned on an emitting surface of the light source 604, either directly or via one or more intervening (e.g., adhesive) layers. In such instances, the wavelength converter 601 may be formed separately from the light source 604, and coupled in a known manner to the light source 604 so that primary light emitted from the light source 604 can interact with the wavelength converter 601.

If the wavelength converter 601 is positioned at a distance from light source 604 (as shown in FIGS. 6A and 6B) it may be supported within the housing 608 by any means, including support from a portion of the housing 608. As may be appreciated, positioning the wavelength converter 601 at a distance from the light source 604 can allow the wavelength converter 601 to be formed into a shape that is different from the surface of the light source 604. For example, the wavelength converter 601 may be in the form of a plate, a dome, or a shell. In any case, the surfaces of the wavelength converter 601 may be planar, concave, convex, ellipsoidal, irregular, another shape, or a combination thereof.

For simplicity, the devices 600 and 650 have been depicted in FIGS. 6A and 6B as including relatively few parts. However, it should be understood that the lighting devices of the present disclosure may include other components and electronics that are commonly found in solid state lighting devices such as LED lamps. By way of example, devices 600, 650 are shown as including a diffuser 614, which may serve to diffuse the secondary light emitted by the wavelength converter 601, as well as unconverted primary light.

EXAMPLES

To explore the impact of phosphor particle/grain size on stability in the context of an inorganic wavelength converter, various inorganic wavelength converters were prepared and tested as described below in examples 3 to 5 below.

Example 3

Figure 7A:
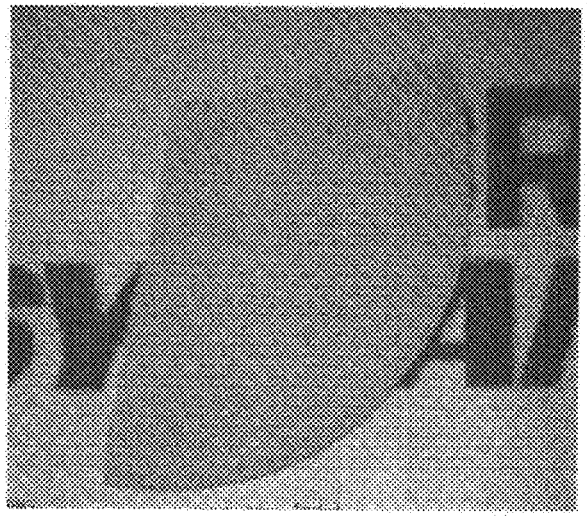
FIGS. 7A and 7B are optical microscope images of one example of an inorganic wavelength converter consistent with the present disclosure.
Figure 7B:
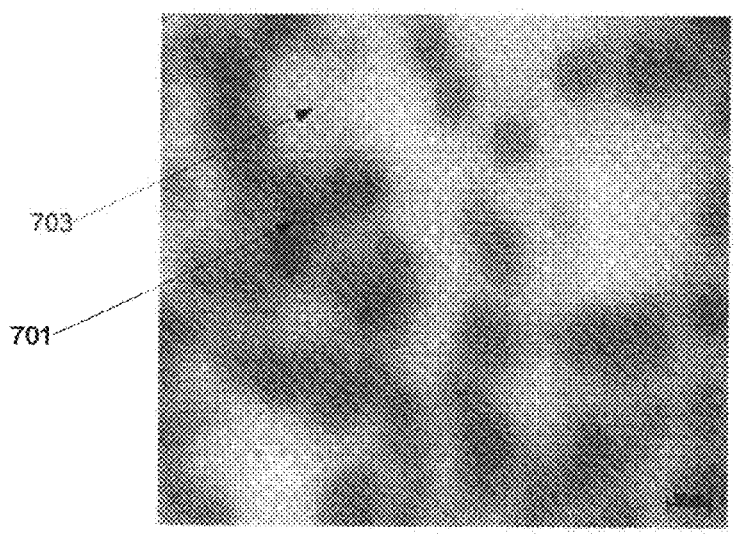

In this example a coarse $(Ca, Sr, Ba)_2Si_5N_8$:Eu phosphor powder with a D50 particle size of 43 μm was combined with fine particles of an inorganic matrix precursor. In particular the coarse $(Ca, Sr, Ba)_2Si_5N_8$:Eu particles were combined with a matrix precursor in the form of fine undoped Ca—SiAlON particles having a D50 of 1.99 μm. The resulting mixed powder contained 15% by weight of coarse $(Ca, Sr, Ba)_2Si_5N_8$:Eu particles, and 85% by weight of the fine undoped Ca—SiAlON particles. To produce an inorganic wavelength converter, 1.6 grams of the mixed powder was placed in a graphite die having a 20 mm diameter, and was spark plasma sintered (SPS) at 1550° C. for 10 minutes under a pressure of 50 mega pascals (MPa). The resulting sintered ceramic wavelength converting disc was ground and thinned to a thickness of about 120 μm for optical measurement. Optical microscope images of the thinned disc are shown in FIGS. 7A and 7B, and show coarse grains 701 of the $(Ca, Sr, Ba)_2Si_5N_8$:Eu phosphor in an undoped Ca—SiAlON matrix 703.

Figure 8:
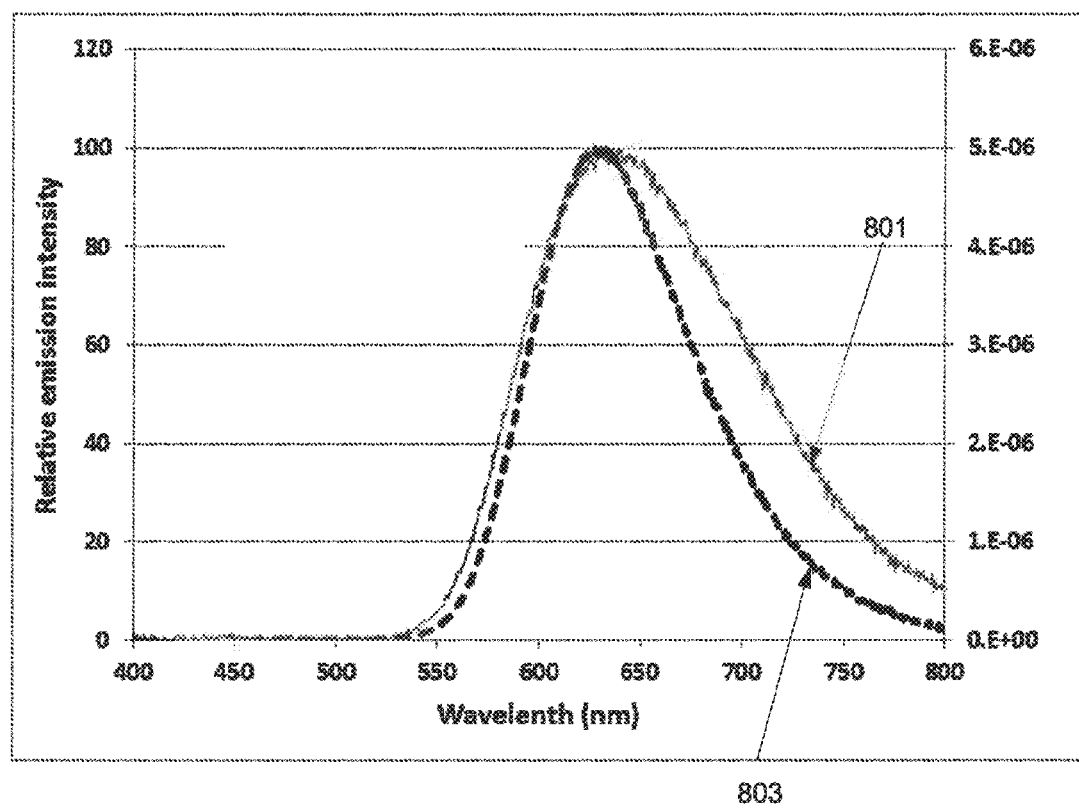
FIG. 8 is a plot of measured emission spectra of the inorganic wavelength converter of FIGS. 7A and 7B, and a red phosphor.

Blue (448 nm) LED light was imparted on the thinned disc, and its emission spectrum 801 was measured and compared to the emission spectrum 803 of the (Ca, Sr, Ba)$_2$Si$_5$N$_8$:Eu phosphor. The measured emission spectra 801, 803 are shown in FIG. 8, which plots the measured relative emission intensity of the thinned disc and the (Ca, Sr, Ba)$_2$Si$_5$N$_8$:Eu phosphor versus wavelength (nm). As shown, the spectrum 801 was red shifted and is wider than the spectrum 803, indicating some reaction between the Ca—SiAlON matrix and the (Ca, Sr, Ba)$_2$Si$_5$N$_8$:Eu phosphor, as well as some damage to the (Ca, Sr, Ba)$_2$Si$_5$N$_8$:Eu phosphor. The conversion efficiency of the disc was 4.3%. Without wishing to be bound by theory, the low conversion efficiency is believed to be the result of damage to the phosphor during the sintering process.

Example 4

Figure 9:
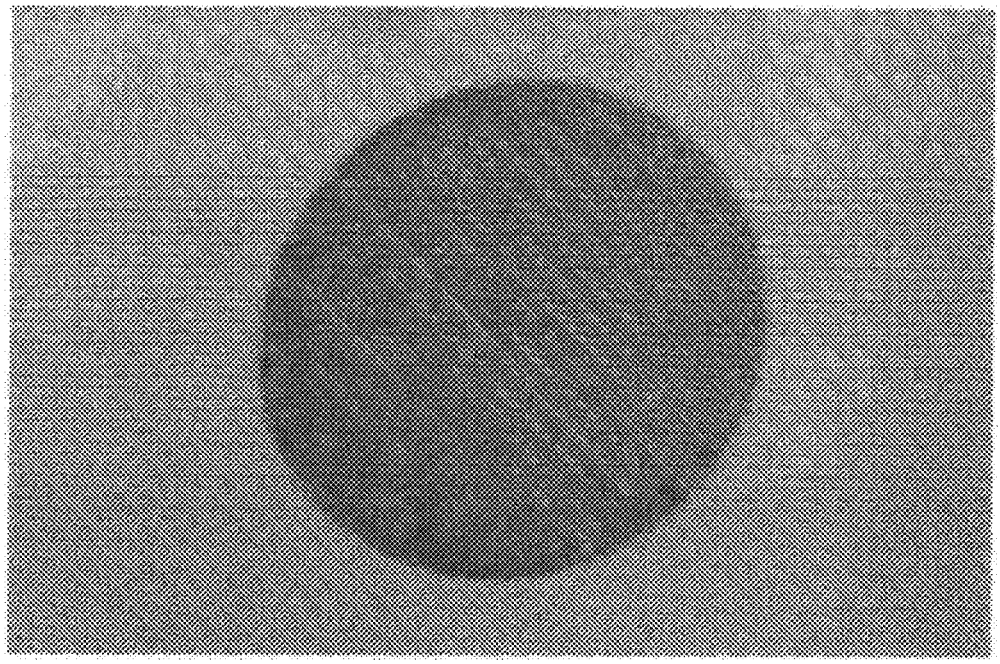
FIG. 9 is an optical microscopy image of another example of an inorganic wavelength converter consistent with the present disclosure.

In this example a coarse (Ca, Sr, Ba)$_2$Si$_5$N$_8$:Eu phosphor powder with a D50 particle size of 43 μm was combined with fine particles of a matrix precursor. In this case, fine aluminum nitride (AlN) particles having a D50 of about 1.0 μm were used as the matrix precursor. The resulting mixed powder contained 15% by weight of coarse (Ca, Sr, Ba)$_2$Si$_5$N$_8$:Eu particles, and 85% by weight of the fine AlN particles. To produce an inorganic wavelength converter, 1.5 grams of the mixed powder was placed in a graphite die having a 20 mm diameter, and was SPS sintered at 1650° C. for 10 minutes under a pressure of 50 MPa. The resulting sintered ceramic wavelength converting disc was ground and thinned to a thickness of about 120 μm for optical measurement. FIG. 9 is an optical microscopy image of the thinned disc, and shows coarse grains of the phosphor in an AlN matrix.

Figure 10:
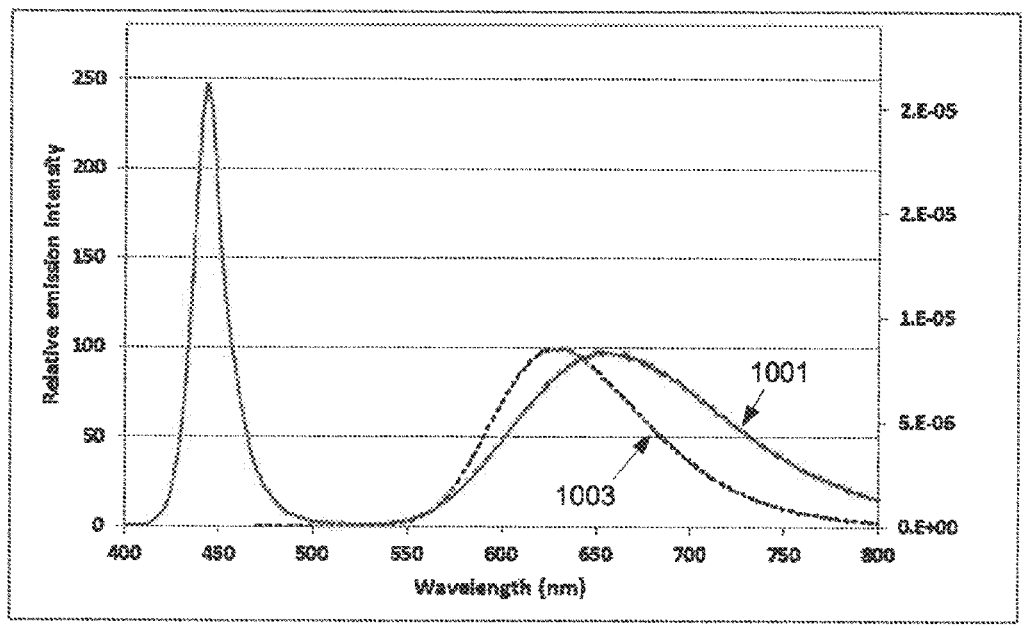
FIG. 10 is a plot of measured emission spectra of the inorganic wavelength converter of FIG. 9, and a red phosphor.

The emission spectra 1001, 1003 of the thinned disc and the (Ca, Sr, Ba)$_2$Si$_5$N$_8$:Eu phosphor were measured in the same manner as the emission spectra 801, 803 described in Example 3. The measured emission spectra 1001, 1003 are shown in FIG. 10 which plots the measured relative emission intensity of the thinned disc and the (Ca, Sr, Ba)$_2$Si$_5$N$_8$:Eu phosphor versus wavelength (nm). As shown, the spectrum 1001 was red shifted and is wider than the spectrum 1003, indicating some reaction between the AlN matrix and the (Ca, Sr, Ba)$_2$Si$_5$N$_8$:Eu phosphor, as well as some damage to the (Ca, Sr, Ba)$_2$Si$_5$N$_8$:Eu phosphor. The conversion efficiency of the disc was 7.6%. Like example 4, the low conversion efficiency is believed to be the result of damage to the phosphor during the sintering process.

Example 5

Figure 11A:
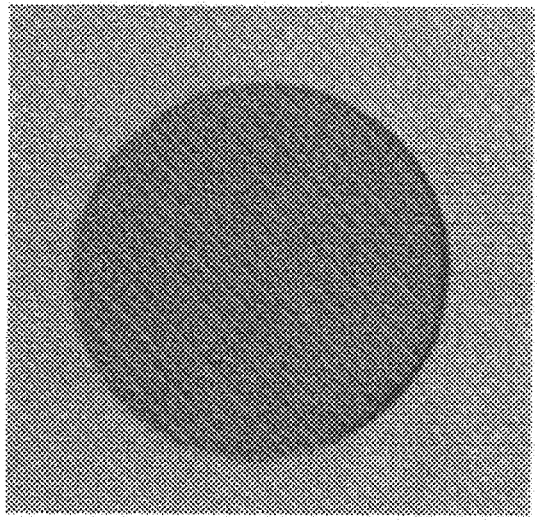
FIGS. 11A and 11B are optical microscopy images of two additional examples of inorganic wavelength converters consistent with the present disclosure.
Figure 11B:
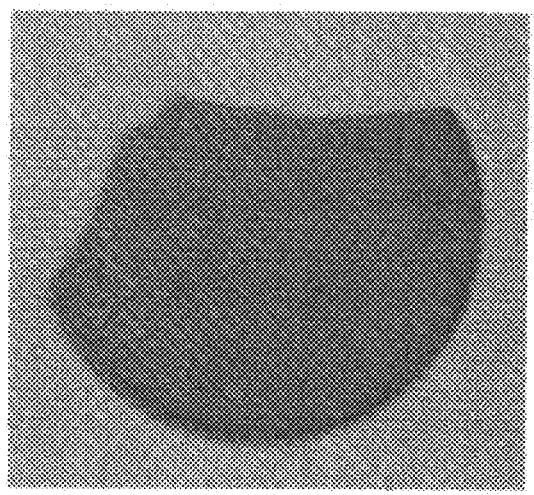

In this example a coarse (Ca, Sr, Ba)$_2$Si$_5$N$_8$:Eu phosphor powder with a D50 particle size of 43 μm and an Eu concentration of 4% was combined with fine particles of a matrix precursor. In this instance the matrix precursor particles were fine particles of a (Sr, Ba)$_2$Si$_5$N$_8$:Eu having a Eu concentration of ≤0.5% and a D50 of 1.44 μm. The resulting mixed powder contained 15% by weight of coarse (Ca, Sr, Ba)$_2$Si$_5$N$_8$:Eu (4%) particles, and 85% by weight of the fine matrix precursor particles. Two, two (2) gram samples of the mixed powder were measured, placed in a graphite die having a 20 mm diameter, and SPS sintered at 1625° C. and 1580° C., respectively, for 10 minutes under a pressure of 50 MPa to produce first and second sintered ceramic wavelength converting discs. The first and second sintered discs were each ground and thinned down to a thickness of about 120 μm for optical measurement. FIGS. 11A and 11B are optical microscopy images of the first and second thinned discs, respectively, and show coarse grains of the (Ca, Sr, Ba)$_2$Si$_5$N$_8$:Eu (≥5%) phosphor in a matrix of (Sr, Ba)$_2$Si$_5$N$_8$:Eu (≤0.5%).

Figure 12A:
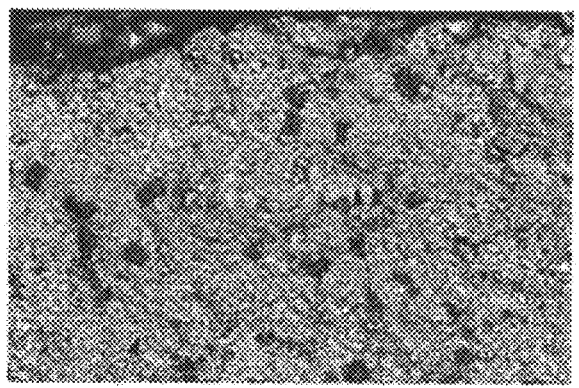
FIGS. 12A and 12B are scanning electron micrograph images of the two additional example inorganic wavelength converters shown in FIGS. 11A, and 11B, respectively.
Figure 12B:
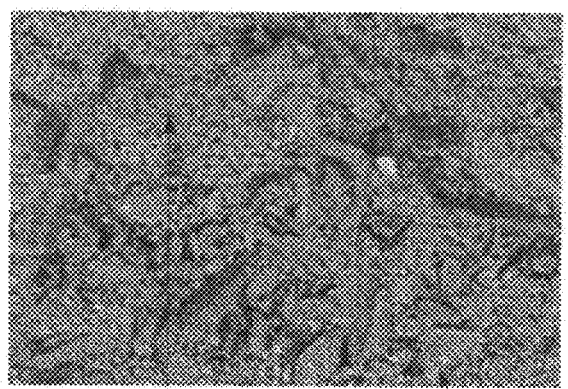

Scanning electronic microscopy images of the first and second thinned discs are provided in FIGS. 12A and 12B, respectively, and show that there are coarse grains of (Ca, Sr, Ba)$_2$Si$_5$N$_8$:Eu (4%) phosphor 1201 within a fine grain matrix 1203 of (Sr, Ba)$_2$Si$_5$N$_8$:Eu (≤0.5%). The dark regions shown in FIG. 12A are BaSi$_7$N$_{10}$ phase in (Sr, Ba)$_2$Si$_5$N$_8$ matrix.

Figure 13:
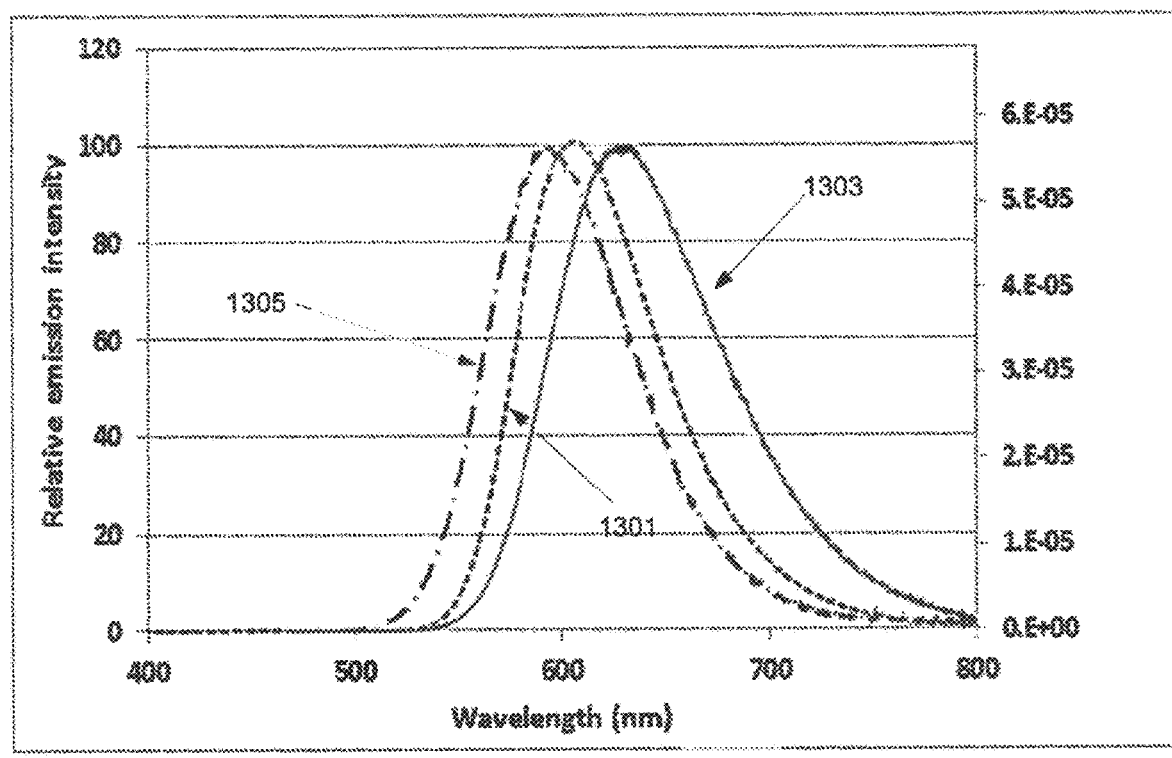
FIG. 13 is a plot of measured emission spectra of the inorganic wavelength converters of FIG. 12B, a red phosphor, and an inorganic matrix material.

The emission spectra of the second thinned disc (1301), the coarse (Ca, Sr, Ba)$_2$Si$_5$N$_8$:Eu (4%) phosphor (1303), and the fine (Sr, Ba)$_2$Si$_5$N$_8$:Eu (≤0.5%) matrix were measured in the same manner as the spectra 801, 803 described in Example 3. The measured emission spectra 1301, 1303, and 1305 are shown in FIG. 13, which plots the measured relative emission intensity of the thinned disc, the (Ca, Sr, Ba)$_2$Si$_5$N$_8$:Eu (4%) phosphor, and the fine (Sr, Ba)$_2$Si$_5$N$_8$:Eu (≤0.5%) versus wavelength (nm). As shown, the spectrum 1201 was between the spectra 1203, 1205. Various optical properties of the two thinned discs were also measured, and are reported in table 2 below.

TABLE 2

| Sample ID | Thickness/ μm | Cx | Cy | CE (lm/W) | Conv. Eff. | w/o blue | | | | SPS condition (° C./Min/MPa) |
| --- | --- | --- | --- | --- | --- | --- | --- | --- | --- | --- |
| | | | | | | Ldom (nm) | Cx | Cy | LER (lm/W) | |
| Example 5 - First Thinned Disc | 122 | 0.6090 | 0.3897 | 81.7 | 33.5% | 596.3 | 0.6094 | 0.3899 | 287 | 1625/10/50 |
| Example 5, second thinned disc | 125 | 0.6064 | 0.3918 | 82.1 | 33.0% | 595.8 | 0.6071 | 0.3922 | 293 | 1580/10/50 |

In which: Cx and Cy are color coordinates derived from the measured emission spectrum of each sample disc with and without the excitation light; CE is the conversion efficacy (Lm/W) measured by placing the sample over an excitation light source (in this case, a Blue LED) and the lumens (lm) measured above the sample is were measured and divided by the optical power (in watts, W) of the excitation source; Conv. Eff. is conversion efficiency (the ratio of optical power from converted phosphor emission to excitation power absorbed by the phosphor; Ldom (nm) is the dominant wavelength in nanometers; LER is luminous efficacy of radiation (i.e., the ratio of lumens to radiation flux in watts, i.e., lm/W); and SPS condition specifies the temperature, time and pressure of the SPS sintering used to form the disc in ° C., minutes, and MPa, respectively. As shown, the conversion efficiency of the two discs was 33.5 and 33.0%, respectively.

The results demonstrate that the fine grain $(Sr, Ba)_2Si_5N_8$:Eu (≤0.5%) matrix is compatible with the stable large-grain phosphor $(Ca, Sr, Ba)_2Si_5N_8$:Eu (≥5%) phosphor for SPS sintering. The two sample discs also present included large grains of the $(Ca, Sr, Ba)_2Si_5N_8$:Eu (≥5%) phosphor and all have good conversion efficiency. In a more preferred embodiment, the large grain $(Ca, Sr, Ba)_2Si_5N_8$:Eu phosphor powders are mixed with undoped $(Sr, Ba)_2Si_5N_8$ fine powders.

Example 6

In another example embodiment, coarse $(Ca, Sr, Ba)_2Si_5N_8$:Eu phosphor particles may be mixed with a matrix precursor in the form of fine particles of undoped $(Ca, Sr, Ba)_2Si_5N_8$. In this case, the ratio of Ca, Sr, and Ba in the undoped $(Ca, Sr, Ba)_2Si_5N_8$:Eu matrix precursor particles is the same or substantially the same as ratio of Ca, Sr, and Ba in the $(Ca, Sr, Ba)_2Si_5N_8$:Eu phosphor particles. The resultant mixture may be placed in a die and SPS sintered as discussed above in examples 3-5. Although undoped $(Ca, Sr, Ba)_2Si_5N_8$ was not available for testing at the time of this application, it is believed that because it is chemically close to those of the $(Ca, Sr, Ba)_2Si_5N_8$:Eu phosphor particles, it will be compatible with such particles. Moreover, it is believed from the prior examples that the result of SPS sintering such a mixture will be a wavelength converter that include coarse grains of $(Ca, Sr, Ba)_2Si_5N_8$:Eu phosphor in a fine grain $(Ca, Sr, Ba)_2Si_5N_8$ matrix.

EMBODIMENTS

The following are additional non-limiting embodiments of the present disclosure.

Embodiment 1

According to this embodiment there is provided a wavelength converter, including: a matrix; and a wavelength conversion material within the matrix; wherein: the wavelength conversion material includes a $(Ca, Sr, Ba)_2Si_5N_8$:Eu phosphor; and the $(Ca, Sr, Ba)_2Si_5N_8$:Eu phosphor has a D50 grain size or a D50 particle size greater than or equal to 5 microns.

Embodiment 2

This embodiment includes any or all of the features of embodiment 1, wherein the $(Ca, Sr, Ba)_2Si_5N_8$:Eu phosphor has a D50 grain size or a D50 particle size greater than or equal to 10 microns.

Embodiment 3

This embodiment includes any or all of the features of embodiment 1, wherein the $(Ca, Sr, Ba)_2Si_5N_8$:Eu phosphor has a D50 grain size or a D50 particle size ≥15 microns.

Embodiment 4

This embodiment includes any or all of the features of embodiment 1, wherein the matrix is an organic matrix and the $(Ca, Sr, Ba)_2Si_5N_8$:Eu phosphor has a D50 particle size ≥5 μm.

Embodiment 5

This embodiment includes any or all of the features of embodiment 4, wherein the organic matrix is a polymer selected from the group consisting of a silicone, an epoxy, an acrylic, or a combination thereof.

Embodiment 6

This embodiment includes any or all of the features of embodiment 5, wherein the $(Ca, Sr, Ba)_2Si_5N_8$:Eu phosphor is present in an amount ranging from greater than 0 to about 30% by weight, relative to the total weight of the wavelength converter.

Embodiment 7

This embodiment includes any or all of the features of embodiment 6, wherein the $(Ca, Sr, Ba)_2Si_5N_8$:Eu phosphor is present in an amount ranging from greater than 0 to about 15% by weight, relative to the total weight of the wavelength converter.

Embodiment 8

This embodiment includes any or all of the features of embodiment 4, wherein the $(Ca, Sr, Ba)_2Si_5N_8$:Eu phosphor is at least one phosphor of the formula: $(Ca_x, Sr_y, Ba_z)_2Si_5N_8$:d % Eu wherein d is the amount of Eu in atomic percent, and the following relationships are met: $0<x<1$; $0<y<1$; $0<z<1$; $x+y+z=1$; and $0<d<10$.

Embodiment 9

This embodiment includes any or all of the features of embodiment 8, wherein: $0.03<x≤0.07$; $0.4<y≤0.5$; $0<z<1$; $x+y+z=1$; and $1.5≤d≤5$.

Embodiment 10

This embodiment includes any or all of the features of embodiment 1, wherein the matrix is an inorganic matrix and the $(Ca, Sr, Ba)_2Si_5N_8$:Eu phosphor has a D50 grain size ≥5 μm.

Embodiment 11

This embodiment includes any or all of the features of embodiment 10, wherein the matrix has a D50 grain size ≤5 μm.

Embodiment 12

This embodiment includes any or all of the features of embodiment 11, wherein the matrix has a D50 grain size ≤1 μm.

Embodiment 13

This embodiment includes any or all of the features of embodiment 10, wherein the inorganic matrix is selected from the group consisting of optically transparent metal nitrides, metal oxynitrides, metal oxides, metal activated silicon nitride phosphors where a concentration of metal activator is greater than 0 but less than 2 atomic %, and undoped silicon nitrides phosphors.

Embodiment 14

This embodiment includes any or all of the features of embodiment 13, wherein the inorganic matrix is selected from the group consisting of aluminum nitride, Ca—SiAlON, an $(Sr, Ba)_2Si_5N_8$:Eu phosphor containing greater than 0 but less than 2 atomic %, and an undoped $(Ca, Sr, Ba)_2Si_5N_8$ phosphor.

Embodiment 15

This embodiment includes any or all of the features of embodiment 14, wherein the inorganic matrix is an undoped $(Ca, Sr, Ba)_2Si_5N_8$ phosphor, and a ratio of Ca, Sr, and Ba in the undoped $(Ca, Sr, Ba)_2Si_5N_8$ phosphor is the same or substantially the same as a ratio of Ca, Sr, and Ba in the $(Ca, Sr, Ba)_2Si_5N_8$:Eu phosphor.

Embodiment 16

This embodiment includes any or all of the features of embodiment 10, wherein the $(Ca, Sr, Ba)_2Si_5N_8$:Eu phosphor is at least one phosphor of the formula: $(Ca_x, Sr_y, Ba_z)_2Si_5N_8$:d % Eu wherein d is the amount of Eu in atomic percent, and the following relationships are met: $0<x<1$; $0<y<1$; $0<z<1$; $x+y+z=1$; and $0<d<10$.

Embodiment 17

This embodiment includes any or all of the features of embodiment 16, wherein: $0.03<x\leq0.07$; $0.4<y\leq0.5$; $0<z<1$; $x+y+z=1$; and $1.5\leq d\leq5$.

Embodiment 18

This embodiment includes any or all of the features of embodiment 11, wherein the $(Ca, Sr, Ba)_2Si_5N_8$:Eu phosphor has a D50 grain size $\geq15$ µm.

Embodiment 19

This embodiment includes any or all of the features of embodiment 12, wherein the $(Ca, Sr, Ba)_2Si_5N_8$:Eu phosphor has a D50 grain size $\geq15$ µm.

Embodiment 20

According to this embodiment there is provided a lighting device including a wavelength converter of any one of embodiments 1 to 19.

The following table correlates the reference numerals in the figures with their respective elements.

| Reference Numeral | Element |
| --- | --- |
| 101 | Particles of second sample powder |
| 105 | Particles of first sample powder |
| 300 | Wavelength converter |
| 301 | Coarse particles |
| 303 | Matrix |
| 310 | First side of wavelength converter |
| 320 | Second side of wavelength converter |
| 325 | Middle portion |
| 400 | Inorganic wavelength converter |
| 401 | Coarse grains |
| 403 | Inorganic matrix |
| 501-511 | Method blocks |
| 600 | Lighting device |
| 601 | Wavelength converter |
| 602 | Reflector |
| 604 | Light source |
| 605 | Primary light |
| 606 | Secondary light |
| 608 | Housing |
| 610 | Aperture |
| 612 | Reflector |
| 614 | Diffuser |
| 650 | Lighting device |
| 701 | Coarse grains |
| 703 | Ca—SiAlON matrix |
| 801 | Emission spectrum of thinned disc |
| 803 | Emission spectrum of $(Ca, Sr, Ba)_2Si_5N_8$: Eu phosphor |
| 1001 | Emission spectrum of thinned disc |
| 1003 | Emission spectrum of $(Ca, Sr, Ba)_2Si_5N_8$: Eu phosphor |
| 1201 | Coarse grains of $(Ca, Sr, Ba)_2Si_5N_8$: Eu (4%) phosphor |
| 1203 | Fine grain matrix of $(Sr, Ba)_2Si_5N_8$: Eu ($\leq0.5\%$) |
| 1301 | Emission spectral of a thinned disc |
| 1303 | Emission spectra of a coarse $(Ca, Sr, Ba)_2Si_5N_8$: Eu (4%) phosphor |
| 1305 | Emission spectra of a fine $(Sr, Ba)_2Si_5N_8$: Eu ($\leq0.5\%$) matrix |

While the principles of the present disclosure have been described herein, it is to be understood by those skilled in the art that this description is made only by way of example and not as a limitation as to the scope of the claimed invention and it should be understood by those skilled in the art that various changes in form and detail may be made therein without departing from the spirit and scope of the disclosed embodiments as defined by the appended claims. The features and aspects described with reference to particular embodiments disclosed herein are susceptible to combination and/or application with various other embodiments described herein. Such combinations and/or applications of such described features and aspects to such other embodiments are contemplated herein. Modifications and other embodiments are contemplated herein and are within the scope of the present disclosure. The scope of the disclosed embodiments is thus indicated by the appended claims and all changes which come within the meaning and range of equivalency of the claims are therefore intended to be embraced.

What is claimed is:

1. A wavelength converter, comprising:
   a matrix; and
   a wavelength conversion material within the matrix;
   wherein:
   the wavelength conversion material comprises a $(Ca_xSr_yBa_z)_2Si_5N_8$:d % Eu phosphor, wherein d is the amount of Eu in atomic percent, and the following relationships are met:

$0.03<x\leq0.07$;

$0.4<y\leq0.5$;

$0<z<1$;

$x+y+z=1$; and $1.5\leq d\leq5$; and said $(Ca_xSr_yBa_z)_2Si_5N_8$:d % Eu phosphor has a D50 grain size greater than or equal to 5 microns; and wherein said matrix is an inorganic matrix selected from the group consisting of optically transparent metal nitrides, metal oxynitrides, metal activated silicon nitride phosphors where a concentration of metal activator is greater than 0 but less than 2 atomic %, and silicon nitrides having the formula $(Ca_xSr_yBa_z)_2Si_5N_8$ where x, y, and z have the same relationship as mentioned with respect to the phosphor; wherein said inorganic matrix has a D50 grain size <5 μm.

2. The wavelength converter of claim 1, wherein said $(Ca_xSr_yBa_z)_2Si_5N_8$:d % Eu phosphor has a D50 grain size greater than or equal to 10 microns.

3. The wavelength converter of claim 1, wherein said $(Ca_xSr_yBa_z)_2Si_5N_8$:d % Eu phosphor has a D50 grain size ≥15 microns.

4. The wavelength converter of claim 1, wherein said inorganic matrix has a D50 grain size <1 μm.

5. The wavelength converter of claim 1, wherein said inorganic matrix is selected from the group consisting of aluminum nitride, Ca—SiAlON, an $(Sr, Ba)_2Si_5N_8$:Eu phosphor where the concentration of Eu is greater than 0 but less than 2 atomic %, and $(Ca_xSr_yBa_z)_2Si_5N_8$.

6. The wavelength converter of claim 5, wherein said inorganic matrix is an $(Ca_xSr_yBa_z)_2Si_5N_8$, and a ratio of Ca, Sr, and Ba in $(Ca_xSr_yBa_z)_2Si_5N_8$ is the same or substantially the same as a ratio of Ca, Sr, and Ba in said $(Ca_xSr_yBa_z)_2Si_5N_8$:d % Eu phosphor.

7. The wavelength converter of claim 1, wherein said phosphor has a D50 grain size ≥15 μm.

8. A lighting device comprising the wavelength converter of claim 1.

* * * * *